(12) United States Patent
Bailey, III et al.

(10) Patent No.: US 6,322,661 B1
(45) Date of Patent: Nov. 27, 2001

(54) METHOD AND APPARATUS FOR CONTROLLING THE VOLUME OF A PLASMA

(75) Inventors: Andrew D. Bailey, III, Pleasanton; Alan M. Schoepp, Santa Cruz; Nicolas Bright, San Jose, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/439,759

(22) Filed: Nov. 15, 1999

(51) Int. Cl.[7] .................................................. H05H 1/00
(52) U.S. Cl. ...................... 156/345; 216/67; 216/68; 204/298.37; 118/723 I
(58) Field of Search ................ 156/345; 118/723 E, 118/723 I, 723 MA; 204/298.37; 216/67, 68

(56) References Cited

U.S. PATENT DOCUMENTS

| 4,948,458 | 8/1990 | Ogle . | |
|---|---|---|---|
| 4,990,229 | 2/1991 | Campbell et al. . | |
| 5,021,114 | * 6/1991 | Saito et al. | 156/345 |
| 5,032,205 | * 7/1991 | Hershkowitz et al. | 156/345 |
| 5,091,049 | 2/1992 | Campbell et al. . | |
| 5,122,251 | 6/1992 | Campbell et al. . | |
| 5,226,967 | 7/1993 | Chen et al. . | |
| 5,401,350 | 3/1995 | Patrick et al. . | |
| 5,421,891 | 6/1995 | Campbell et al. . | |
| 5,429,070 | 7/1995 | Campbell et al. . | |
| 5,540,800 | 7/1996 | Qian . | |
| 5,587,038 | 12/1996 | Cecchi et al. . | |
| 5,669,975 | 9/1997 | Ashtiani . | |
| 5,810,932 | 9/1998 | Ueda et al. . | |
| 5,811,022 | * 9/1998 | Savas et al. | 156/345 |
| 6,030,486 | * 2/2000 | Loewenhardt et al. | 156/345 |
| 6,096,160 | 8/2000 | Kadomura . | |
| 6,189,484 | 2/2001 | Yin et al. . | |

FOREIGN PATENT DOCUMENTS

| 0 838 843 | 4/1998 | (EP) . |
|---|---|---|
| 4-329875 | * 11/1992 | (JP) . |

* cited by examiner

*Primary Examiner*—Thi Dang
(74) *Attorney, Agent, or Firm*—Beyer EWeaver & Thomas,LLP

(57) ABSTRACT

A plasma confinement arrangement for controlling the volume of a plasma while processing a substrate inside a process chamber using a plasma enhanced process is disclosed. The arrangement includes a first magnetic bucket having a plurality of first magnetic elements. The first magnetic elements being configured for producing a first magnetic field inside the process chamber. The arrangement further includes a second magnetic bucket having a plurality of second magnetic elements. The second magnetic elements being configured for producing a second magnetic field inside the process chamber. The second magnetic field being configured to combine with the first magnetic field to produce a resultant magnetic field between the first magnetic bucket and the second magnetic bucket. The resultant magnetic field being configured to permit by-product gas from the processing to pass through while substantially confining the plasma within a volume defined at least by the process chamber and the resultant magnetic field.

48 Claims, 9 Drawing Sheets

METHOD AND APPARATUS FOR CONTROLLING THE VOLUME OF A PLASMA

CROSS-REFERENCE TO RELATED CASES

This application is related to following concurrently filed U.S. patent applications:

application Ser. No.: 06/439,661 entitled "IMPROVED PLASMA PROCESSING SYSTEMS AND METHODS THEREFOR".

application Ser. No.: 09/470,236 entitled "PLASMA PROCESSING SYSTEM WITH DYNAMIC GAS DISTRIBUTION CONTROL";

application Ser. No.: 09/439,675 entitled "TEMPERATURE CONTROL SYSTEM FOR PLASMA PROCESSING APPARATUS";

Application Ser. No.: 09/440,418 entitled "METHOD AND APPARATUS FOR PRODUCING UNIFORM PROCESS RATES", application Ser. No.: 09/440,794 entitled "MATERIALS AND GAS CHEMISTRIES FOR PLASMA PROCESSING SYSTEMS", Each of the above-identified patent application is incorporated herein by reference.

BACKGROUND OF THE INVENTION

The present invention relates to apparatus and methods for processing substrates such as semiconductor substrates for use in IC fabrication or glass panels for use in flat panel display applications. More particularly, the present invention relates to controlling a plasma inside a plasma process chamber.

Plasma processing systems have been around for some time. Over the years, plasma processing systems utilizing inductively coupled plasma sources, electron cyclotron resonance (ECR) sources, capacitive sources, and the like, have been introduced and employed to various degrees to process semiconductor substrates and glass panels.

During processing, multiple deposition and/or etching steps are typically employed. During deposition, materials are deposited onto a substrate surface (such as the surface of a glass panel or a wafer). For example, deposited layers such as $SiO_2$ may be formed on the surface of the substrate. Conversely, etching may be employed to selectively remove materials from predefined areas on the substrate surface. For example, etched features such as vias, contacts, or trenches may be formed in the layers of the substrate.

One particular method of plasma processing uses an inductive source to generate the plasma. FIG. 1 illustrates a prior art inductive plasma processing reactor 100 that is used for plasma processing. A typical inductive plasma processing reactor includes a chamber 102 with an antenna or inductive coil 104 disposed above a dielectric window 106. Typically, antenna 104 is operatively coupled to a first RF power source 108. Furthermore, a gas port 110 is provided within chamber 102 that is arranged for releasing gaseous source materials, e.g., the etchant source gases, into the RF-induced plasma region between dielectric window 106 and a substrate 112. Substrate 112 is introduced into chamber 102 and disposed on a chuck 114, which generally acts as a bottom electrode and is operatively coupled to a second RF power source 116.

In order to create a plasma, a process gas is input into chamber 102 through gas port 110. Power is then supplied to inductive coil 104 using first RF power source 108. The supplied RF energy passes through dielectric window 106 and a large electric field is induced inside chamber 102. The electric field accelerates the small number of electrons present inside the chamber causing them to collide with the gas molecules of the process gas. These collisions result in ionization and initiation of a discharge or plasma 118. As is well known in the art, the neutral gas molecules of the process gas when subjected to these strong electric fields lose electrons, and leave behind positively charged ions. As a result, positively charged ions, negatively charged electrons and neutral gas molecules (and/or atoms) are contained inside the plasma 118.

Once the plasma has been formed, neutral gas molecules inside the plasma tend to be directed towards the surface of the substrate. By way of example, one of the mechanism contributing to the presence of the neutrals gas molecules at the substrate may be diffusion (i.e., the random movement of molecules inside the chamber). Thus, a layer of neutral species (e.g., neutral gas molecules) may typically be found along the surface of substrate 112. Correspondingly, when bottom electrode 114 is powered, ions tend to accelerate towards the substrate where they, in combination with neutral species, activate the etching reaction.

Plasma 118 predominantly stays in the upper region of the chamber (e.g., active region), however, portions of the plasma tend to fill the entire chamber. The plasma typically goes where it can be sustained, which is almost everywhere in the chamber. By way of example, the plasma may fill the areas below the substrate such as the bellows of the pumping arrangement (e.g., non-active region). If the plasma reaches these areas, etch, deposition and/or corrosion of the areas may ensue, which may lead to particle contamination inside the process chamber, i.e., by etching the area or flaking of deposited material. Accordingly, the lifetime of the chamber parts is typically reduced.

Furthermore, an unconfined plasma tends to form a non uniform plasma, which may lead to variations in the process performance, i.e. etch uniformity, overall etch rate, etch profile, micro-loading, selectivity, and the like. As a result, it is extremely difficult to control the critical dimensions of the integrated circuit. Additionally, variations in the process performance may lead to device failure in the semiconductor circuit, which typically translates into higher costs for the manufacturer.

The standard solution for controlling the plasma has been to provide a plasma screen inside the plasma reactor. The plasma screen is generally dimensioned to confine the plasma within a volume defined by the process chamber and the plasma screen. In most cases, the plasma screen also includes a plurality of openings for permitting by-product gases formed during processing to pass through to the exhaust ports of the plasma reactor.

Referring to FIGS. 1 & 2, a plasma screen 202 is shown in conjunction with plasma processing chamber 100. Plasma screen 202 is typically configured to substantially fill the gap made between the inside periphery of a chamber wall 120 and the outer periphery of electrostatic chuck 114. Further, plasma screen 202 typically includes a plurality of perforations 204 that are dimensioned to allow the by-product gas, formed during processing, to escape and be exhausted out of an exhaust port 122. At the same time, perforations 204 are dimensioned to confine the plasma to the volume defined by process chamber 102. The perforations are generally patterned to be circular, slotted, concentric and/or the like. Further still, the plasma screen is typically attached (e.g., bolted) to the chamber in a fixed position.

However, the plasma screen has some drawbacks. Typically, structures that are disposed inside the processing chamber during processing tend to cause contamination of the substrate. This is because such structures may present sites or surfaces for adsorbed materials to attach, for example, etch by-products and deposits, which may flake off onto the substrate causing particle contamination. Particle contamination may produce undesirable and/or unpredictable results. For example, particles on the substrate surface may block a portion of the substrate that needs to be etched. In this manner, a trench may not be formed properly and this may lead to device failure and therefore a reduction in productivity. Further, the plasma screen has to be cleaned at various times during processing to prevent excessive build-ups of deposits and etched by-products. Cleaning disadvantageously lowers substrate throughput, and typically adds costs due to loss of production.

Additionally, the plasma screen reduces the conductance path for the by-product gases. By way of example, the plasma screen typically reduces the conductance path of by-product gas from 30% to 60%. This tends to increase the demand on the pumping arrangement. That is, a larger turbo-molecular pump has to be used in order to effectively remove the byproduct gases and maintain the desired chamber pressure through the reduced conductance.

Moreover, the perforations may get clogged during processing, which may further reduce the conductance. Again, a loss of conductance may adversely effect the proper functioning of the pumping system, i.e., reduce the flow. This may lead to process variation, and reduce the life of the pump, which further reduces productivity and typically adds cost. Further still, plasma screens tend to be consumable items because they are in contact with the plasma and therefore tend to be bombarded by the reactive species in the plasma.

In addition, bolting the plasma screen to the chamber typically limits the types of materials that can be used without breaking during normal installation. Further still, the electrical and thermal contact between the plasma screen and the chamber can be difficult to ensure.

In view of the foregoing, there are desired improved techniques and apparatuses for controlling the volume of a plasma inside a process chamber.

SUMMARY OF THE INVENTION

The invention relates, in one embodiment, to a plasma processing apparatus for processing a substrate. The apparatus includes a substantially cylindrical process chamber within which a plasma is both ignited and sustained for processing. The apparatus further includes a plasma confinement arrangement. The plasma confinement arrangement includes an outer magnetic bucket disposed around the periphery of the process chamber. The outer magnetic bucket having a plurality of first magnetic elements that are disposed radially and symmetrically about the axis of the process chamber. The plurality of first magnetic elements being configured to produce a first magnetic field.

The plasma confinement arrangement further includes an inner magnetic bucket disposed inside the process chamber and having a diameter that is smaller than the diameter of the outer magnetic bucket. The inner magnetic bucket having a plurality of second magnetic elements that are disposed radially and symmetrically about the axis of the process chamber. The plurality of second magnetic elements being configured to produce a second magnetic field. The plasma confinement arrangement being configured to use the first magnetic field and the second magnetic field to produce a plasma confinement magnetic field between the outer magnetic bucket and the inner magnetic bucket that permits by-product gas from processing to pass through while substantially confining the plasma within a volume defined at least by the substantially cylindrical process chamber and the plasma confinement magnetic field.

The invention relates, in another embodiment, to a method for controlling the volume of a plasma while processing a substrate in a process chamber using a plasma enhanced process. The method includes producing a first magnetic field inside the process chamber with a first magnetic element. The method further includes producing a second magnetic field inside the process chamber with a second magnetic element. The method additionally includes combining the first magnetic field and the second magnetic field to produce a resultant magnetic field between the first magnetic elements and the second magnetic elements. The method also includes creating the plasma inside the process chamber and confining the plasma within a volume defined at least by a portion of the process chamber and the resultant magnetic field.

The invention relates, in another embodiment, to a plasma confinement arrangement for controlling the volume of a plasma while processing a substrate inside a process chamber using a plasma enhanced process. The arrangement includes a first magnetic bucket having a plurality of first magnetic elements. The first magnetic elements being configured for producing a first magnetic field inside the process chamber. The arrangement further includes a second magnetic bucket having a plurality of second magnetic elements. The second magnetic elements being configured for producing a second magnetic field inside the process chamber.

The second magnetic field being configured to combine with the first magnetic field to produce a resultant magnetic field between the first magnetic bucket and the second magnetic bucket. The resultant magnetic field being configured to permit byproduct gas from the processing to pass through while substantially confining the plasma within a volume defined at least by the process chamber and the resultant magnetic field.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF PREFERRED EMBODIMENTS

Figure 1:
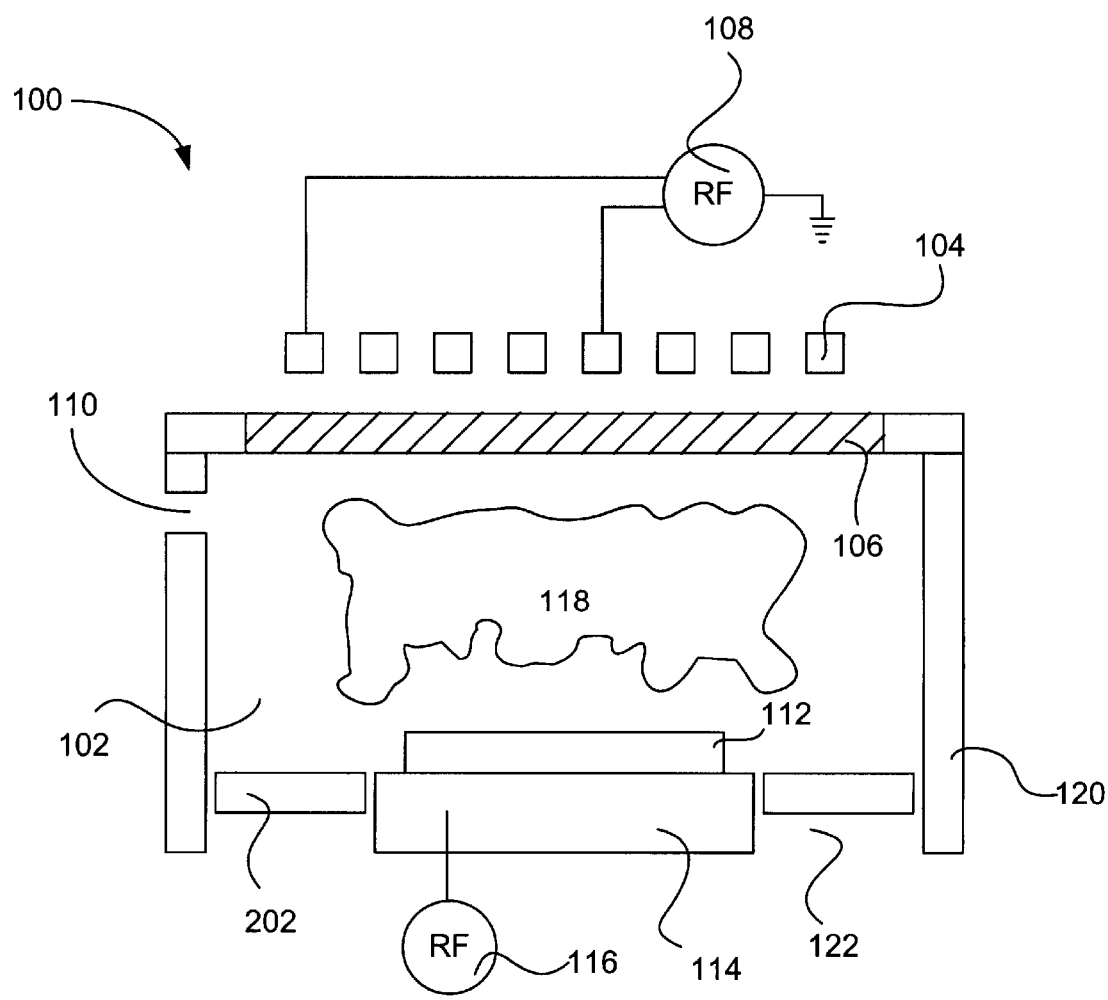
FIG. 1 illustrates a prior art inductive plasma processing reactor that is used for plasma processing.
Figure 2:
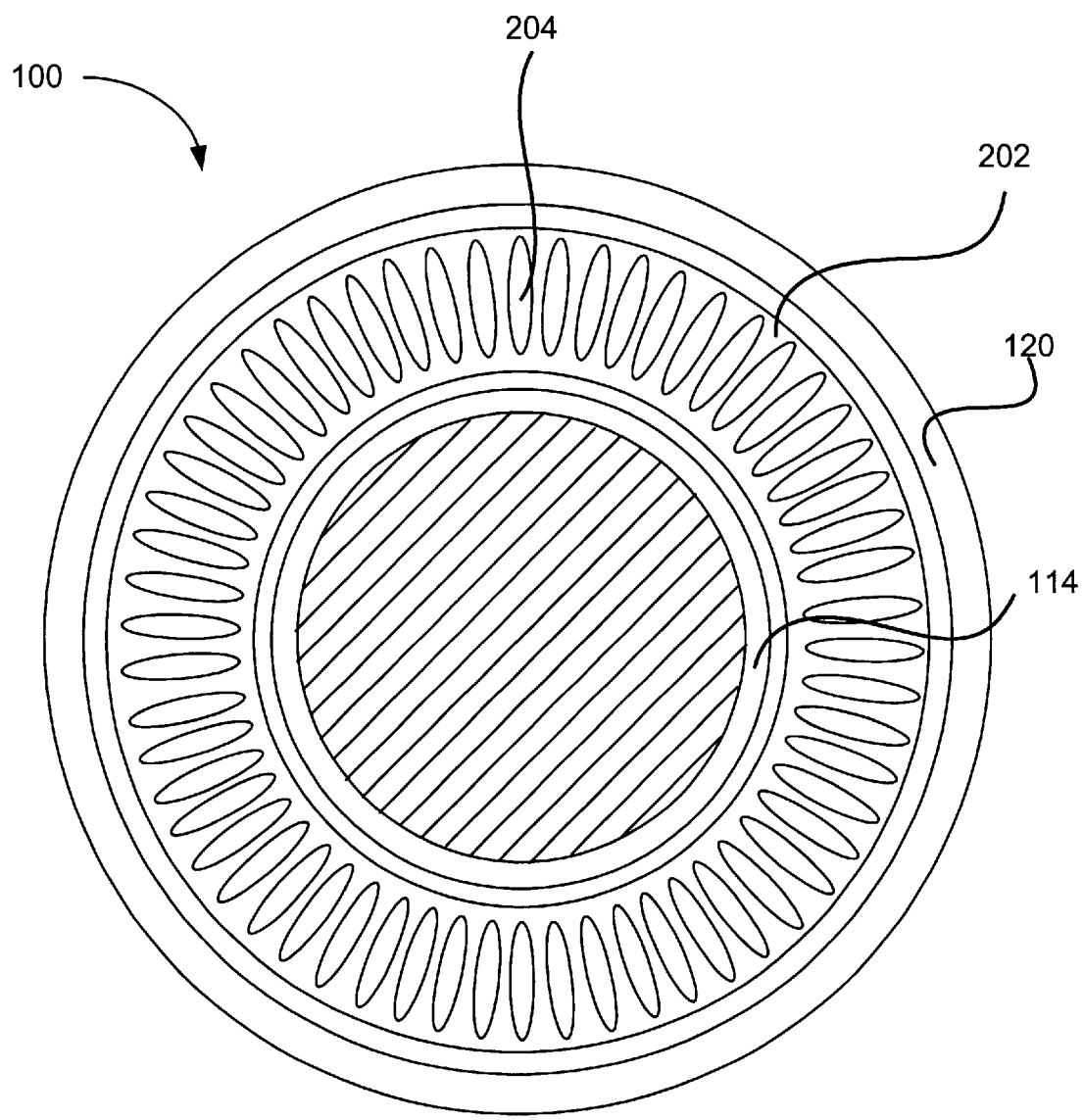
FIG. 2 shows a top view of the prior art inductive plasma processing reactor shown in FIG. 1

The present invention will now be described in detail with reference to a few preferred embodiments thereof and as illustrated in the accompanying drawings. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

In one embodiment, the present invention provides a plasma processing apparatus for processing a substrate. The plasma processing apparatus includes a substantially cylindrical process chamber within which a plasma is both ignited and sustained for processing the substrate. The plasma processing apparatus further includes a plasma confinement arrangement being configured with an outer magnetic bucket that produces a first magnetic field and an inner magnetic bucket that produces a second magnetic field. The first magnetic field and the second magnetic field are used to produce a plasma confinement magnetic field between the outer magnetic bucket and the inner magnetic bucket that permits by-product gas from processing to pass through while substantially confining the plasma within a volume defined at least by the substantially cylindrical process chamber and the plasma confinement magnetic field.

Plasma processing takes place while a substrate is disposed on a chuck within the plasma processing chamber. A process gas, which is input into a plasma processing chamber, is energized and a plasma is created. The plasma tends to fill the entire process chamber, moving to both active areas and to non-active areas. In the active area, the ions of the plasma are accelerated towards the substrate, where they in combination with the neutral reactants at the surface of the substrate react with materials disposed on the substrate surface to process the substrate. In the non-active area, adverse processing conditions are typically produced, for example, a non-uniform plasma density or reactions with unprotected regions of the chamber, i.e., exhaust port can be encountered.

In accordance with one aspect of the present invention, improved confinement of a plasma inside a plasma processing reactor is achieved by introducing a magnetic field inside the process chamber. The magnetic field is configured to prevent the plasma from moving to non-active areas of the process chamber. More specifically, the magnetic field is arranged to force the plasma away from the non active areas and to concentrate the plasma proximate to the active area of the process chamber. As a result, the plasma is substantially confined to a predetermined region (e.g., active area) of the process chamber.

While not wishing to be bound by theory, it is believed that a magnetic field can be configured to influence the direction of the charged particles, e.g., negatively charged electrons and positively charged ions, in the plasma. The magnetic field can be arranged to act as a mirror field that temporarily captures the charged particles in the plasma (spiraling around the field lines), and eventually redirects them in a direction away from the magnetic field. In other words, if a charged particle tries to cross the magnetic field, it tends to feel the influence of the magnetic field and turn around or reflect away. In this manner, the magnetic field inhibits movement of the plasma across an area defined by the magnetic field.

In a preferred embodiment, the aforementioned magnetic field or plasma confining magnetic field is created by introducing an outer magnetic bucket and an inner magnetic bucket into the plasma processing system. The magnetic buckets create a magnetic field that covers the area between the inner magnetic bucket and the outer magnetic bucket. As mentioned, the magnetic field is configured to prevent the plasma from moving to non-active areas of the process chamber and to substantially confine the plasma to a volume defined by at least the process chamber and plasma confining magnetic field. Preferably, the outer magnetic bucket is disposed around the periphery of the process chamber, and the inner magnetic bucket is disposed within the periphery of the process chamber. However, the actual placement may vary according to the specific design of each plasma processing system.

Furthermore, the outer magnetic bucket is preferably configured to have a plurality of first magnetic elements, and the inner magnetic bucket is preferably configured to have a plurality of second magnetic elements, both of which are disposed radially and symmetrically about the axis of the process chamber and configured to produce a magnetic field. The combined magnetic fields of the first and second magnetic elements produce a resultant magnetic field (e.g., plasma confining magnetic field) that permits by-product gas from processing to pass through, while substantially confining the plasma within a volume defined at least by the process chamber and the plasma confining magnetic field. More specifically, the plasma confinement magnetic field is configured to allow the passage of neutral particles, and block the passage of charged particles.

Figure 3:
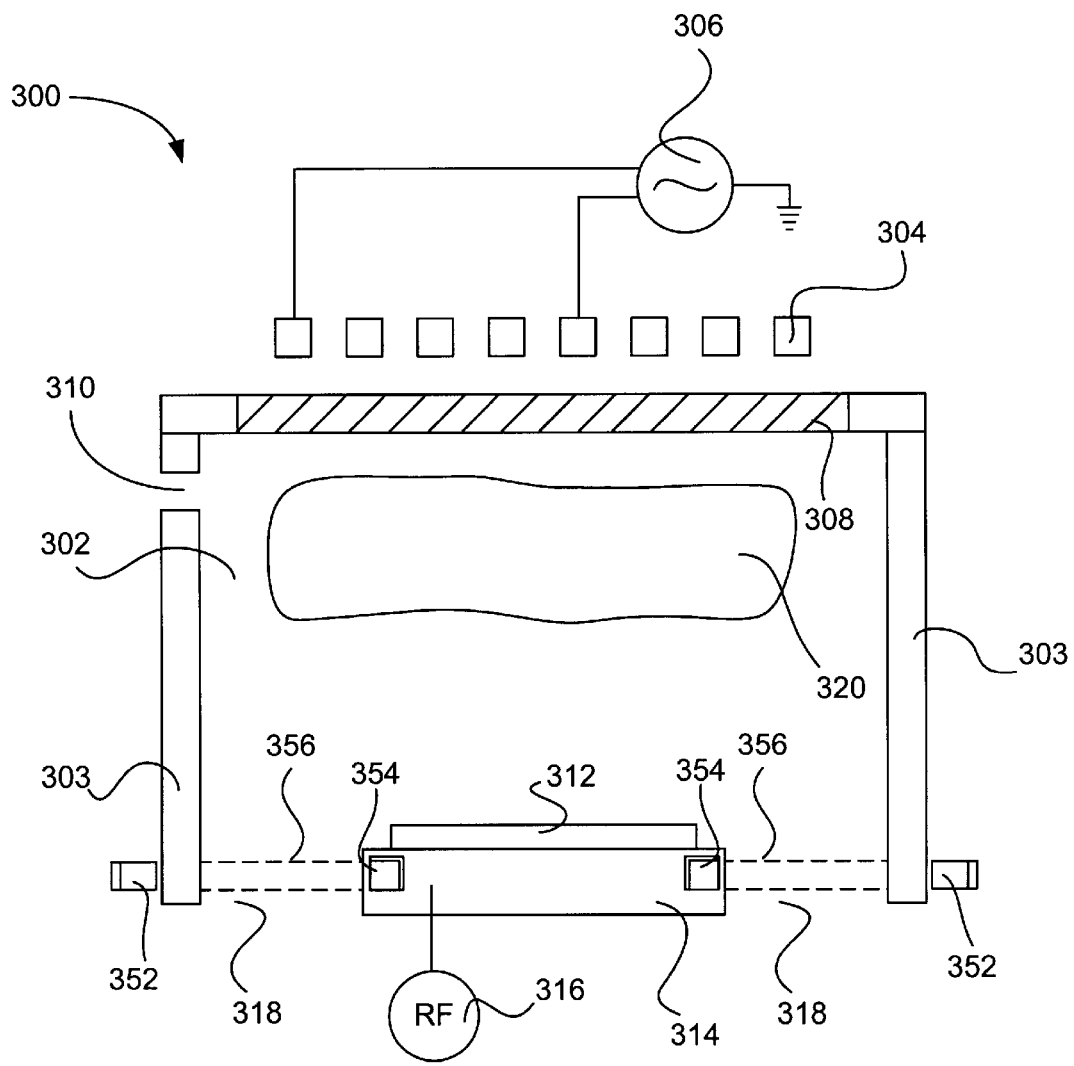
FIG. 3 illustrates an exemplary plasma processing system with a plasma confinement arrangement, in accordance with one embodiment of the present invention.
Figure 4:
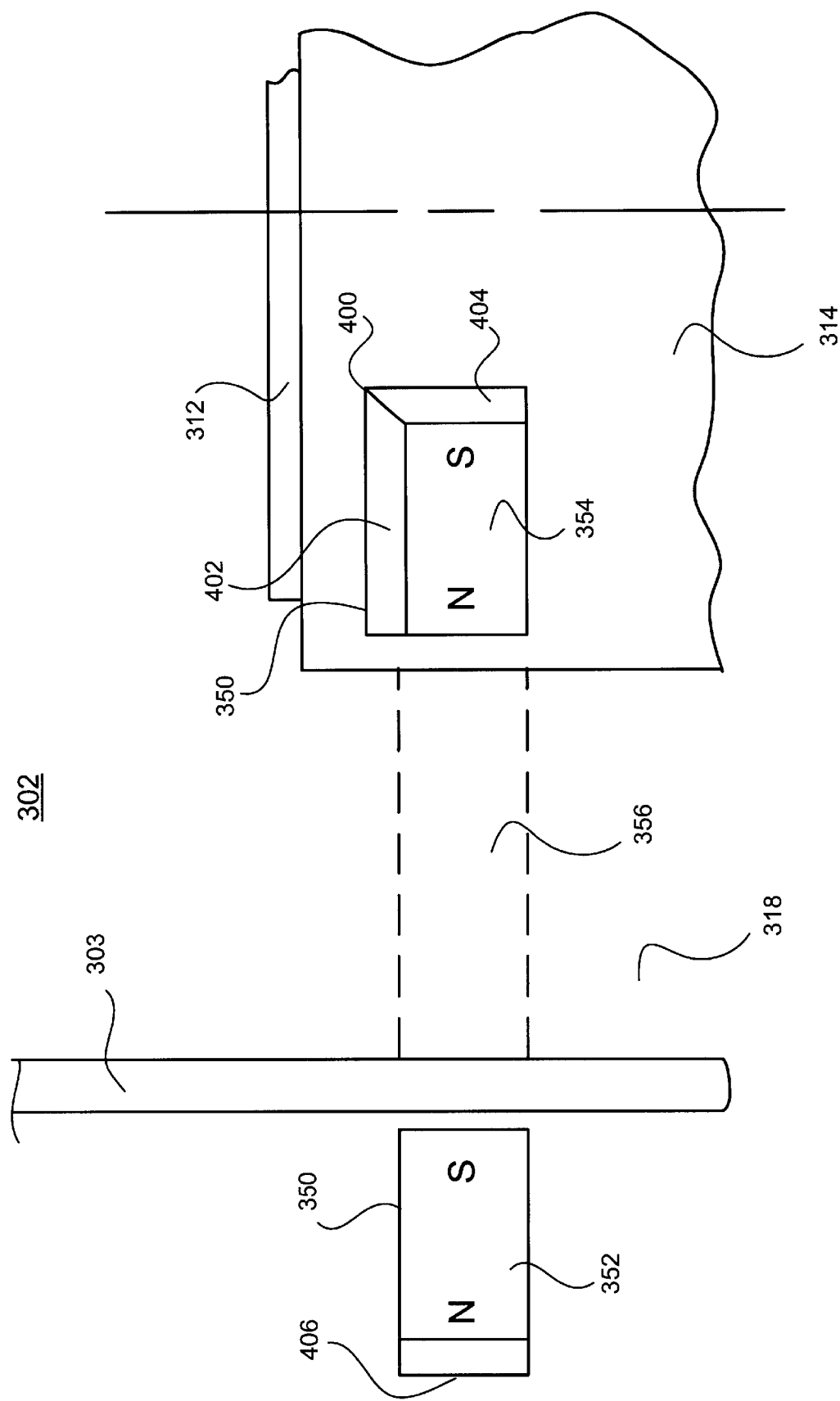
FIG. 4 shows a broken away side view of the exemplary plasma processing system with a plasma confinement arrangement, in accordance with one embodiment of the present invention.

To facilitate discussion of this aspect of the present invention, FIGS. 3 & 4 illustrate an exemplary plasma processing system 300 that uses the aforementioned magnetic buckets. The exemplary plasma processing system 300 is shown as an inductively coupled plasma reactor, however, it should be noted that the present invention may be practiced in any plasma reactor that is suitable for forming a plasma, such as a capacitively coupled or an ECR reactor.

Plasma processing system 300 includes a plasma processing chamber 302, a portion of which is defined by a chamber wall 303. For ease of manufacturing and simplicity of operation, process chamber 302, is preferably configured to be substantially cylindrical in shape with substantially vertical chamber walls 303. However, it should be noted that the present invention is not limited to such and that various configurations of the process chamber may be used.

Outside chamber 302, there is disposed an antenna arrangement 304 (represented by a coil) that is coupled to a first RF power supply 306 via a matching network (not shown in FIG. 3 to simplify the illustration). First RF power supply 306 is configured to supply antenna arrangement 304 with RF energy having a frequency in the range of about 0.4 MHz to about 50 MHz. Furthermore, a dielectric window 308 is disposed between antenna 304 and a substrate 312. Substrate 312 represents the work-piece to be processed, which may represent, for example, a semiconductor substrate to be etched, deposited, or otherwise processed or a glass panel to be processed into a flat panel display. By way of example, an antenna/dielectric window arrangement that may be used in the examplary plasma processing system is described in greater detail in a co-pending patent application entitled, "METHOD AND APPARATUS FOR PRODUCING UNIFORM PROCESS RATES", U.S. patent application Ser. No. 09/440418, filed on even date and incorporated herein by reference.

A gas injector 310 is typically provided within chamber 302. Gas injector 310 is preferably disposed around the inner periphery of chamber 302 and is arranged for releasing gaseous source materials, e.g., the etchant source gases, into the RF-induced plasma region between dielectric window 308 and substrate 312. Alternatively, the gaseous source materials may also be released from ports built into the walls of the chamber itself or through a shower head arranged in the dielectric window. By way of example, a gas distribution system that may be used in the examplary plasma processing system is described in greater detail in a co-pending patent application entitled, "PLASMA PROCESSING SYSTEM WITH DYNAMIC GAS DISTRIBUTION CONTROL"; U.S. patent application Ser. No. 09/439,675, filed on even date and incorporated herein by reference.

For the most part, substrate 312 is introduced into chamber 302 and disposed on a chuck 314, which is configured to hold the substrate during processing. Chuck 314 may represent, for example, an ESC (electrostatic) chuck, which secures substrate 312 to the chuck's surface by electrostatic force. Typically, chuck 314 acts as a bottom electrode and is preferably biased by a second RF power source 316. Second RF power source 316 is configured to supply RF energy having a frequency range of about 0.4 MHz to about 50 MHz.

Additionally, chuck 314 is preferably arranged to be substantially cylindrical in shape and axially aligned with process chamber 302 such that the process chamber and the chuck are cylindrically symmetric. However, it should be noted that this is not a limitation and that chuck placement may vary according to the specific design of each plasma processing system. Chuck 314 may also be configured to move between a first position (not shown) for loading and unloading substrate 312 and a second position (not shown) for processing the substrate.

Still referring FIGS. 3 & 4, an exhaust port 320 is disposed between chamber walls 303 and chuck 314. However, it should be noted that the actual placement of the exhaust port may vary according to the specific design of each plasma processing system. Preferably, exhaust port 320 is configured for exhausting by-product gases formed during processing. Further, exhaust port 320 is coupled to a turbomolecular pump (not shown), typically located outside of chamber 302. As is well known to those skilled in the art, the turbomolecular pump maintains the appropriate pressure inside chamber 302.

Furthermore, in the case of semiconductor processing, such as etch processes, a number of parameters within the processing chamber need to be tightly controlled to maintain high tolerance results. The temperature of the processing chamber is one such parameter. Since the etch tolerance (and resulting semiconductor-based device performance) can be highly sensitive to temperature fluctuations of components in the system, accurate control therefore is required. An example of a temperature management system that may be used in the exemplary plasma processing system to achieve temperature control is described in greater detail in a co-pending patent application entitled, "TEMPERATURE CONTROL SYSTEM FOR PLASMA PROCESSING APPARATUS"; U.S. patent application Ser. No. 09/439,675, filed on even date and incorporated herein by reference.

Additionally, another important consideration in achieving tight control over the plasma process is the material utilized for the plasma processing chamber, e.g., the interior surfaces such as the chamber wall. Yet another important consideration are the gas chemistries used to process the substrates. An example of both materials and gas chemistries that may be used in the exemplary plasma processing system are described in greater detail in a co-pending patent application entitled, "MATERIALS AND GAS CHEMISTRIES FOR PLASMA PROCESSING SYSTEMS", U.S patent application Ser. No. 09/440,794, filed on even date and incorporated herein by reference.

In order to create a plasma, a process gas is input into chamber 302 through gas injector 310. Power is then supplied to antenna 304 using first RF power source 306, and a large electric field is produced inside chamber 302. The electric field accelerates the small number of electrons present inside the chamber causing them to collide with the gas molecules of the process gas. These collisions result in ionization and initiation of a discharge or plasma 320. As is well known in the art, the neutral gas molecules of the process gas when subjected to these strong electric fields lose electrons, and leave behind positively charged ions. As a result, positively charged ions , negatively charged electrons and neutral gas molecules are contained inside plasma 320.

Once the plasma has been formed, neutral gas molecules inside the plasma tend to be directed towards the surface of the substrate. By way of example, one of the mechanism contributing to the presence of the neutrals gas molecules at the substrate may be diffusion (i.e., the random movement of molecules inside the chamber). Thus, a layer of neutral species (e.g., neutral gas molecules) may typically be found along the surface of substrate 112. Correspondingly, when bottom electrode 314 is powered, ions tend to accelerate towards the substrate where they, in combination with neutral species, activate substrate processing, i.e., etching, deposition and/or the like.

There is also shown in FIGS. 3 & 4, a plasma confinement arrangement, which includes an outer magnetic bucket 352 and an inner magnetic bucket 354. As mentioned, outer magnetic bucket 352 and inner magnetic bucket 354 are configured to produce linked magnetic fields that combine to form a plasma confining magnetic field 356. In a preferred embodiment, plasma confining magnetic field 356 is preferably disposed between chamber walls 303 and chuck 314. In this manner, the plasma is prevented from entering exhaust port 318, and therefore plasma 320 is substantially confined inside process chamber 302. However, it should be noted that the actual placement of the plasma confining magnetic field within the process chamber may vary according to the specific design of each plasma processing system.

Although FIGS. 3 & 4 show outer magnetic bucket 352 and an inner magnetic bucket 354 in the same plane, it should be understood that they may be offset. The only requirement is that a portion of outer magnetic bucket 352 and an inner magnetic bucket 354 be in the same plane. If there is no overlap, the plasma confining field may not be as effective at confining the plasma.

Referring to FIG. 4, the plasma confining magnetic field 356 is arranged to be substantially parallel to substrate 314 and disposed below a plane defined by the top surface of substrate 314. The inner and outer magnetic buckets are preferably disposed between about 0.25 and about 1.5 inches below the substrate. However, it should be noted that the inner and outer magnetic buckets may be disposed anywhere in the process chamber so long as they do not produce a magnetic field that is proximate to the substrate. By way of example, the plasma confinement apparatus may be disposed above the substrate to confine the plasma to a smaller region or to direct the plasma to a specific region in the chamber, much like a uniformity ring. Furthermore, the plasma confining magnetic field is not limited to being parallel to the substrate and may be disposed in other positions such as at angle with respect to the plane defined by the substrate.

Advantageously, there is no need for a plasma screen, which typically increases particle contamination, increases cost of consumable parts, increases cleaning steps, and reduces gas flow conductance. Further, because the plasma is confined to a specific volume a more uniform plasma density is obtained wherein a more uniform etch can be achieved, i.e., the center and the edge of the substrate have substantially the same process rates.

Figure 5:
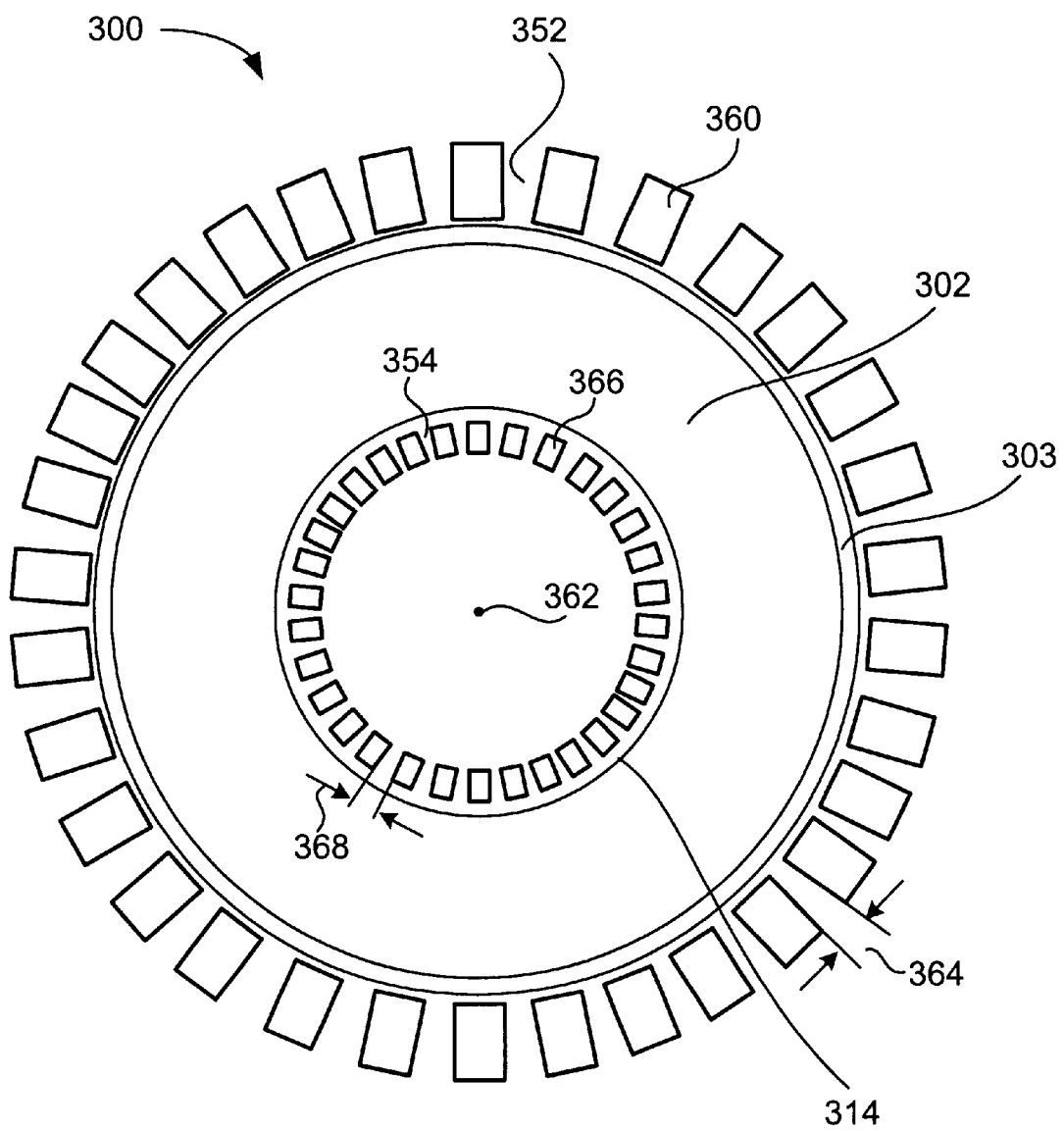
FIG. 5 illustrates a top view of the plasma processing reactor with a plasma confinement arrangement, in accordance with one embodiment of the present invention.
Figure 6:
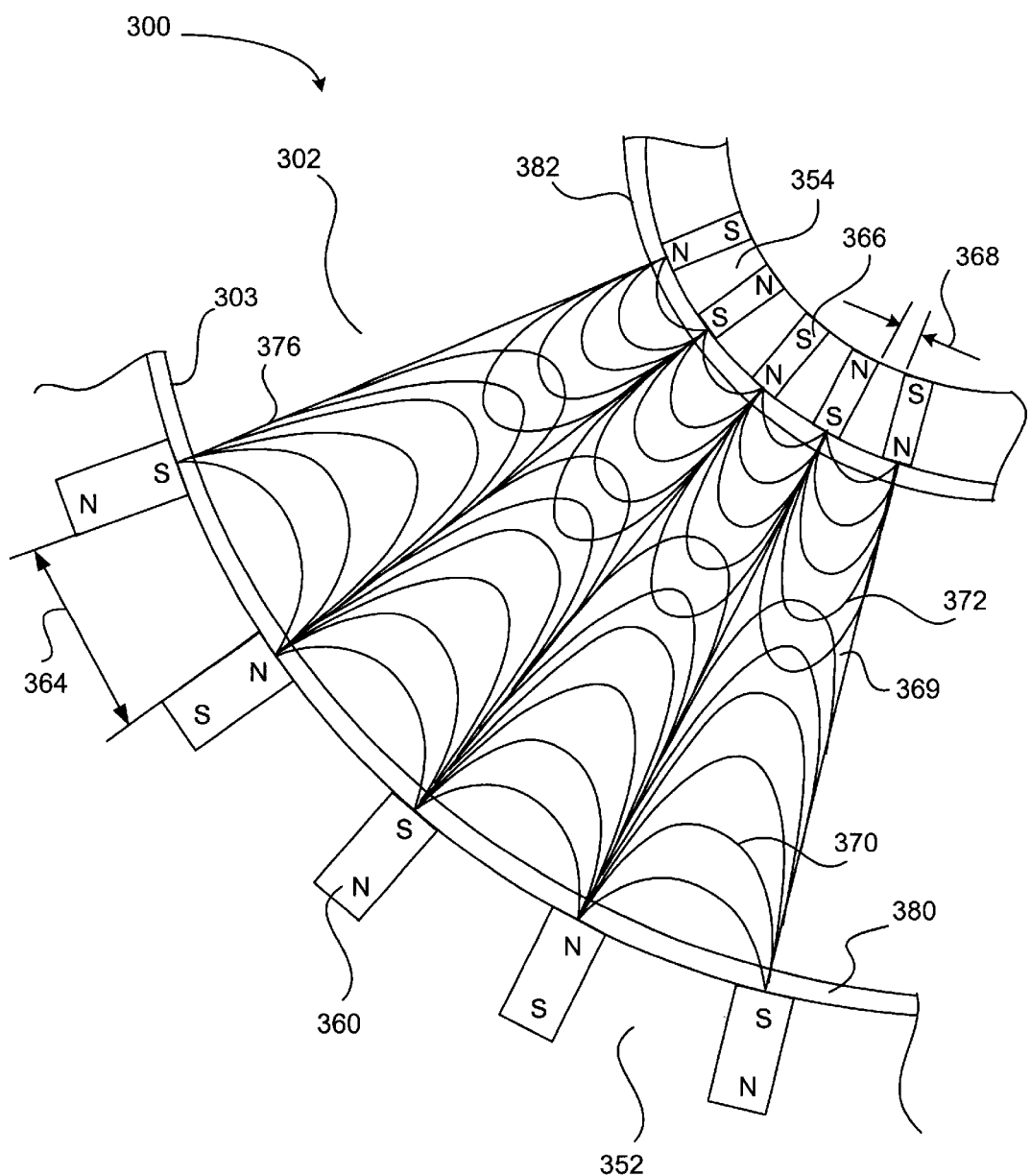
FIG. 6 shows a broken away top view of the plasma processing reactor with the plasma confinement arrangement, in accordance with one embodiment of the present invention.

To further discuss the features of the inventions and their advantages over the prior art, FIGS. 5 & 6 illustrate a top view of plasma processing reactor 300 with the plasma confinement arrangement, in accordance with one aspect of the present invention. As mentioned, plasma confinement arrangement 350 includes outer magnetic bucket 352 and inner magnetic bucket 354. Preferably, outer magnetic bucket 352 is disposed about the periphery of process chamber 302. In one embodiment, outer magnetic bucket 352 is preferably disposed outside of chamber walls 303. However, it should be noted that the outer magnetic bucket may be disposed within the chamber walls, and inside the process chamber, as well.

Correspondingly, inner magnetic bucket 354 is disposed within the periphery of process chamber 303. Preferably, the diameter of inner magnetic bucket 354 is smaller than the diameter of outer magnetic bucket 352. In one embodiment, inner magnetic bucket 354 is disposed inside of chuck 314. However, it should be noted that this is not a limitation and that the inner magnetic bucket may be placed at various locations within the process chamber. By way of example, the inner magnetic bucket may be disposed inside a uniformity ring disposed above the chuck.

Referring to FIGS. 5 & 6, outer magnetic bucket 352 includes a plurality of first magnetic elements 360 that are disposed radially and symmetrically about an axis 362 of process chamber 302. Preferably, first magnetic elements 360 are axially oriented about the periphery of the process chamber such that either of their cusps (e.g., N or S) point toward axis 362. As is well known to those skilled in the art, cusps are the areas on the magnetic elements where the field lines group together, i.e., the north or south ends of the magnet elements. Further still, first magnetic elements 360 are spatially offset along the periphery of the process chamber such that a spacing 364 is provided between each of first magnetic elements 360. It should be understood that the size of the spacing may vary according to the specific design of each plasma processing system.

There is also shown in FIGS. 5 & 6, inner magnetic bucket 354 which includes a plurality of second magnetic elements 366 that are disposed radially and symmetrically about axis 362 of process chamber 302. Much like the first magnetic elements 360, second magnetic elements 366 are axially oriented about the periphery of the chuck such that either of their cusps (e.g., N or S) point toward axis 362. Further, second magnetic elements 366 are spatially offset along the periphery of the chuck such that a spacing 368 is provided between each of second magnetic elements 366. Again, it should be understood that the size of the spacing may vary according to the specific design of each plasma processing system.

Moreover, the total number of first magnetic elements 360 is preferably equal to the total number of second magnetic elements 366 such that each of the first magnetic elements has a corresponding second magnetic element. In one implementation, the total number of first magnetic elements is about 32. However, the actual number of magnetic elements per chamber may vary according to the specific design of each plasma processing system. In general, the number of magnetic elements should be sufficiently high to ensure that there is a strong enough plasma confining magnetic field to effectively confine the plasma. Having too few magnetic elements may create low points in the plasma confining magnetic field, which as a result may enable the plasma access to undesired areas. However, too many magnetic elements may degrade the density enhancement because the losses are typically highest at the cusp along the field lines.

In a preferred embodiment, the cusps of first magnetic elements 366 are axially aligned with the cusps of the corresponding second magnetic elements 360, and have magnetization vectors that preferably point in the same direction. As is well known to those skilled in the art, the magnetization vectors of the magnetic elements define the direction of the poles (e.g., N/S). Further, the magnetization vectors of the first magnetic elements and the corresponding second magnetic elements preferably alternate their direction around the axis of the process chamber (e.g., N/S, S/N, N/S, S/N, etc.)

Preferably but not necessarily, both the first magnetic elements and the second magnetic elements are configured to be permanent magnets that are about the same size and produce about the same magnetic flux. However, having the same size and magnetic flux is not a limitation, and in some configurations it may be desirable to have magnetic elements with different magnetic fluxes and sizes. By way of example, a magnetic flux of about 50 to about 1500 Gauss may be suitable for generating a plasma confining magnetic field 369 that is sufficiently strong to inhibit the movement of the plasma. Some things that may effect the amount of flux and size of magnets needed are the gas chemistries, power, plasma density, etc. Preferably, the permanent magnets are formed from a sufficiently powerful permanent magnet material, for example, one formed from NdFeB or SmCo families of magnetic material. In some small chambers, AlNiCo or ceramics may also work well.

Although permanent magnets are employed for implementing the plasma confinement arrangement, it is also possible to implement the plasma confinement arrangement using electromagnets. Electromagnets offer the advantage of controlling the amount magnetic flux, so that better process control may be achieved. However, electromagnets tend to further complicate the manufacturablity of the system and therefore might not be practical.

Referring now to FIG. 6, first magnetic elements 360 are configured to produce a first magnetic field 370 and second magnetic elements 366 are configured to produce a second magnetic field 372. Preferably, a portion of first magnetic field 370 overlaps a portion of second magnetic field 372. More specifically, a portion of the field lines of the magnetic elements are configured to combine, such that the resulting field strength in the annular gap is increased. Further, the magnetic elements are preferably configured to connect field lines 376 between axial oriented magnetic elements 360, 366. Both field components 370, 372 and pulling across of connecting field lines 376 produce the desired plasma confining magnetic field 369. The magnetic fields 370, 372 are pulled across the annular gap or exhaust port between chamber wall 303 and chuck 314 to provide a sufficient plasma confining magnetic field 369 that covers the annular gap. Although, it has been shown to cover the area between the chuck and the chamber walls, it should be understood that placement of the plasma confining field may vary, for example, the field could be used to exclude the plasma from any predetermined region of the process chamber.

For the most part, the strength of the magnetic flux of the magnetic elements has to be high in order to have significant field strength away from the magnets and to effect the connected field topology shown. If too low of a magnetic flux is chosen, regions of low field in the plasma confining magnetic field will be larger, and therefore the plasma confining magnetic field may not be as effective at inhibiting the plasma. Thus, it is preferable to maximize the overlap of the magnetic fields, and connecting fields to minimize the low field regions. Preferably, the combined first and second magnetic fields or plasma confinement magnetic field have a magnetic combined field strength effective to prevent the plasma from passing through the plasma confinement magnetic field. More specifically, the plasma confinement magnetic field should have a magnetic flux in the range of about 15 to about 1500 Gauss, preferably from about 50 to about 1000 Gauss, and more preferably from about 100 to about 800 Gauss.

Typically, a first wall 380 is disposed between first magnetic elements 360 and process chamber 302 and a second wall 382 is disposed between second magnetic elements 366 and process chamber 302. First wall 380 may represent, for example, chamber walls 303, and second wall 382 may represent, for example, a portion of chuck 314. Preferably, the walls (e.g., chamber wall and portion of chuck) are formed from a non-magnetic material that is substantially resistant to a plasma environment.

By way of example, the walls may be formed from SiC, SiN, Quartz, Anodized Al, Boron Nitride, Boron Carbide and the like.

Furthermore, the distance between the magnetic elements and the process chamber should be minimized in order to make better use of the magnetic energy produced by the magnetic elements. That is, the closer the magnetic elements are to the process chamber, the greater the intensity of the magnetic field produced within the process chamber. If the distance is large, a larger magnet may be needed to get the desired magnetic field. Preferably, the distance is between about 1/16" and about 1 inches. It should be understood that the distance may vary according to the specific material used between the magnetic elements and the process chamber.

With respect to the magnetic fields employed, it is generally preferred to have zero or near zero magnetic fields proximate to the substrate. A magnetic flux near the surface of the substrate tends to adversely effect process uniformity. Therefore, the magnetic fields produced by plasma confinement arrangement are preferably configured to produce substantially zero magnetic fields above the substrate.

In accordance with another aspect of the present invention, a plurality of flux plates are provided to control stray magnetic fields produced by the first and second magnetic elements of the plasma confinement arrangement. The flux plates are configured to short circuit the magnetic field in areas that a magnetic field is not desired, for example, the magnetic field that typically bulges out on the non-used side of the magnetic elements. Further, the flux plates redirect some of the magnetic field therefore a more intense magnetic field may be directed in the desired area. Preferably, the flux plates minimize the strength of the magnetic field in the region of the substrate, and as a result the magnetic elements can be placed closer to the substrate. Accordingly, a zero or near zero magnetic field proximate to the surface of the substrate may be achieved.

Referring back to FIG. 4, plasma confinement arrangement 350 includes a plurality of flux plates for controlling stray magnetic fields. In one embodiment, an inner flux plate 400 is disposed continuously around the inner and top periphery of inner magnetic bucket 354, i.e., side closest to the substrate. Inner flux plate 400 is preferably arranged to block and redirect stray magnetic fields that tend to be directed towards substrate 312. Preferably, inner flux plate 400 includes a first component 402 and a second component 404. First component 402 is preferably disposed along the top surface of inner magnetic bucket 354 and second component 404 is preferably disposed along the inner periphery of inner magnetic bucket 354. Furthermore, inner flux plate 400 is preferably disposed proximate to inner magnetic bucket 354. More preferably, inner flux plate 400 is in intimate contact with inner magnetic bucket 354. This arrangement tends to gain the most advantage in redirecting the magnetic fields towards the annular region.

It should be understood that these positions are not a limitation and that the first and second components may be disposed in other positions so long as they substantially prevent stray magnetic fields from forming proximate to the substrate. Further, the inner flux plate is not limited to two components and may be configured as a single component or have greater than two components.

In another embodiment, an outer flux plate 406 is disposed continuously around the outer periphery of outer magnetic bucket 352 to redirect the magnetic fields into the chamber where they contribute to limiting the plasma volume, i.e., efficient use of the magnets. Additionally, the outer flux plate restricts the possibility for external magnetic perturbations from affecting the design. Furthermore, outer flux plate 406 is preferably disposed proximate to outer magnetic bucket 352. More preferably, outer flux plate 406 is in intimate contact with inner magnetic bucket 352 (for the same reasons as recited above with respect to the inner flux plate).

Generally, the flux plates are formed from a material that can absorb (e.g., short circuit) the stray magnetic fields. For example, the flux plates may be formed from a material with high magnetic permeability ($\mu$). In one embodiment, the flux plates are formed from cold rolled steel. In another embodiment, the flux plates are formed from iron.

Advantageously, the inner flux plate enables the second magnetic elements to be placed closer to the substrate without creating a magnetic field near the surface of the substrate. In this manner, the plasma confinement magnetic field may be disposed closer to the substrate and therefore the plasma may be more confined. Additionally, by placing the magnetic elements closer to the substrate more of the exhaust port may be covered.

Furthermore, it should be understood that the inner flux plates may not be needed when the inner magnetic bucket is a good distance away from the substrate. In these cases, the distance between the top surface of the inner magnetic bucket and the bottom surface of the substrate should be about the size of the first magnet elements, or about the size of the spacing between the first magnetic elements, whichever is smaller. If the magnets are small, the field lines tend to close on the magnet. If the spacing is small, the field lines tend to close on the next magnet. In either case, the field lines tend not to close proximate the substrate. By way of example, the distance between the magnets and the substrate, without the use of flux plates, should be between about 1 to about 2 inches.

Figure 7:
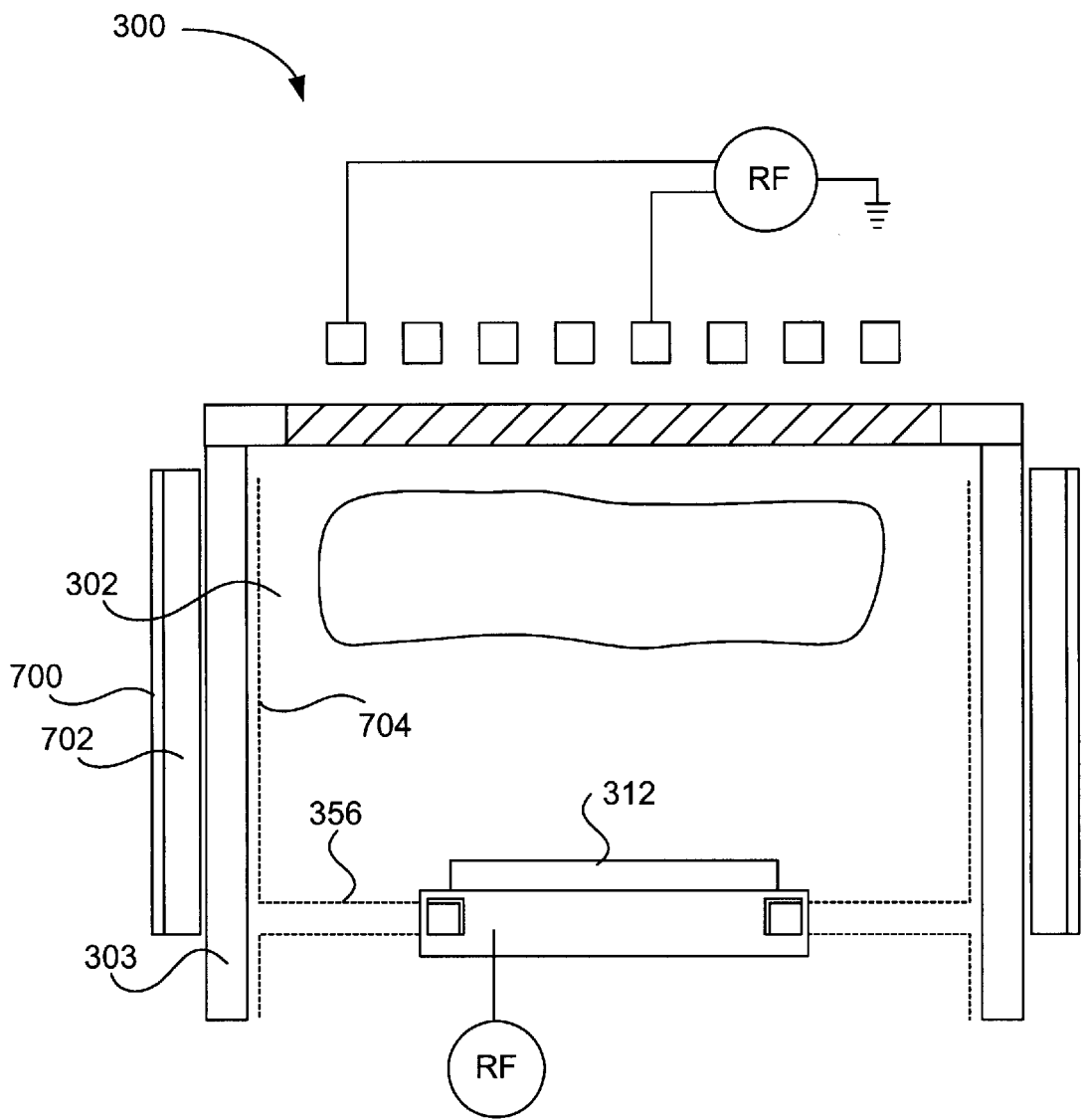
FIG. 7 illustrates an exemplary plasma processing system having a larger outer bucket whose first magnetic elements span from the top of the chamber to the bottom of the chamber, in accordance with one embodiment of the present invention.

Although FIGS. 3 & 4 show the outer magnetic bucket to include magnetic elements that only span a portion of the height of the process chamber, such is not a requirement. By way of example, FIG. 7 shows plasma processing system 300 of FIG. 3 with a larger outer magnetic bucket 700. Larger outer magnetic bucket includes a plurality of longer magnetic elements 702, which span from the top of process chamber 302 to beyond the bottom of process chamber 302. Larger outer magnetic bucket 700 offers even more advantages over the prior art. That is, longer magnetic elements 702 are configured to force a substantial number of the plasma density gradients to concentrate near the chamber walls away from the substrate by producing a chamber wall magnetic field 704 proximate to chamber wall 303. In this manner, uniformity is further enhanced as the plasma density gradient change across substrate 312 is minimized. In combination with plasma confining magnetic field 356, process uniformity is improved to a much greater degree in the improved plasma processing system than is possible in many plasma processing systems. An example of such a bucket arrangement is described in greater detail in the co-pending patent application entitled, "IMPROVED PLASMA PROCESSING SYSTEMS AND METHODS THEREFOR". U.S. patent application Ser. No. 09/439,661, filed on even date and incorporated herein by reference.

As can be seen from the foregoing, the present invention offers numerous advantages over the prior art. By way of example, the invention provides a magnetic field that is configured for confining a plasma, while permitting by-product gas from processing to pass through. Correspondingly, the magnetic field substantially prevents the plasma from moving to non-active areas of the process chamber. More importantly, the plasma can be controlled to a specific volume and a specific location inside the process chamber. In this manner, a more uniform plasma density is obtained, which as a result tends to produce more uniform processing, i.e., the center and the edge of the substrate having substantially the same etch rate during etching. Furthermore, the present invention advantageously produces a magnetic field inside the chamber that is not disposed proximate to the surface of the substrate. As a result, the processing conditions at the surface of the substrate are more stable.

Advantageously, there is no need for a plasma screen, which typically increases particle contamination, increases cost of consumable parts, increases cleaning steps, and reduces gas flow conductance. Correspondingly, the present invention increases the conductance of chamber as a whole, and therefore the processing window is enlarged, i.e., pump speed, gas flow, and pressure. Furthermore, without losing conductance, the processing system is allowed to operate at lower pressures, and use smaller pumps. Additionally, a symmetrical gas flow around the surface of the substrate is produced, which as a result produces a more uniform process rate. Moreover, the present invention is relatively inexpensive over the life of the plasma processing system.

Note that although the preferred embodiment contemplates that the magnetic field produced be sufficiently strong to confine the plasma without having to introduce a plasma screen into the chamber, it is possible to employ the present invention along with the plasma screen to increase plasma confinement. By way of example, the magnetic field may be used as a first means for confining the plasma and the plasma screen may be used as a second means for confining the plasma.

Figure 8A:
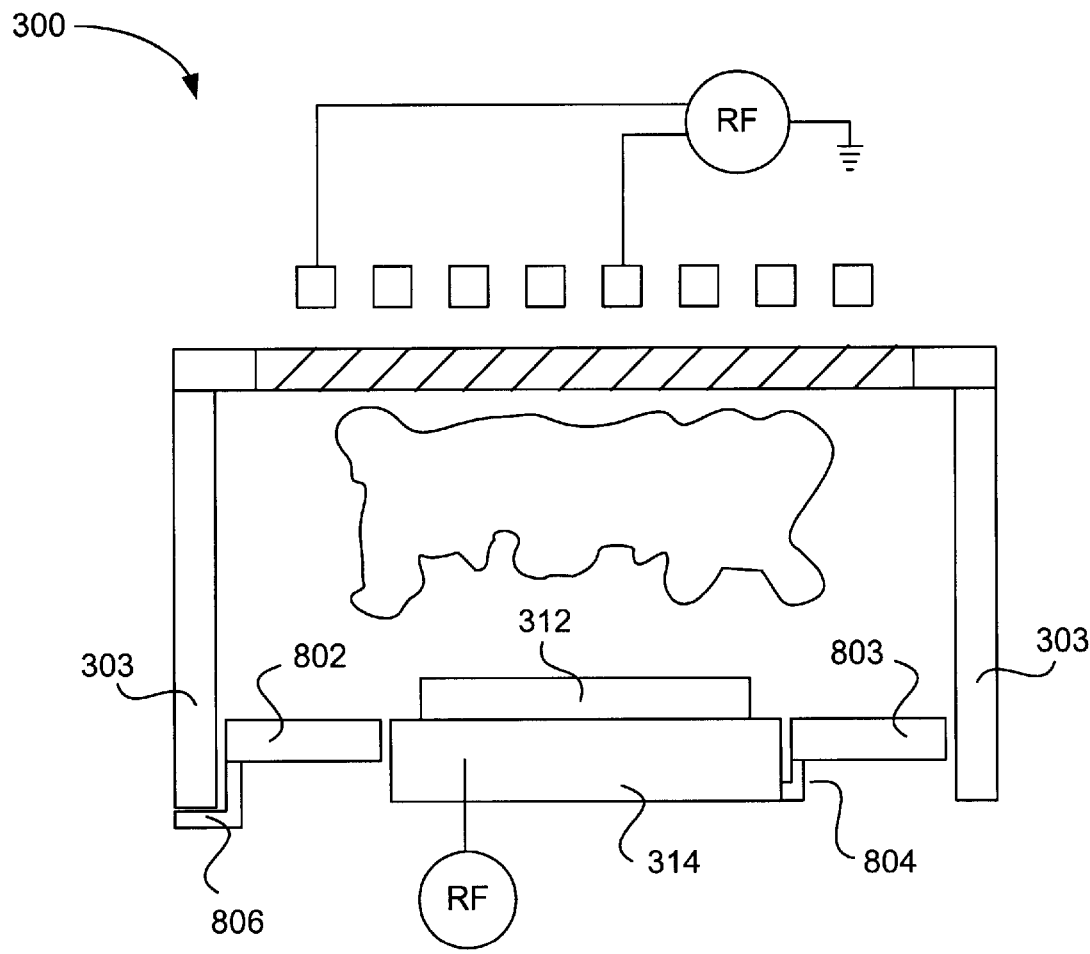
FIG. 8A illustrates an exemplary plasma processing system that uses a plasma confinement arrangement and a plasma screen, in accordance with one embodiment of the present invention.
Figure 8B:
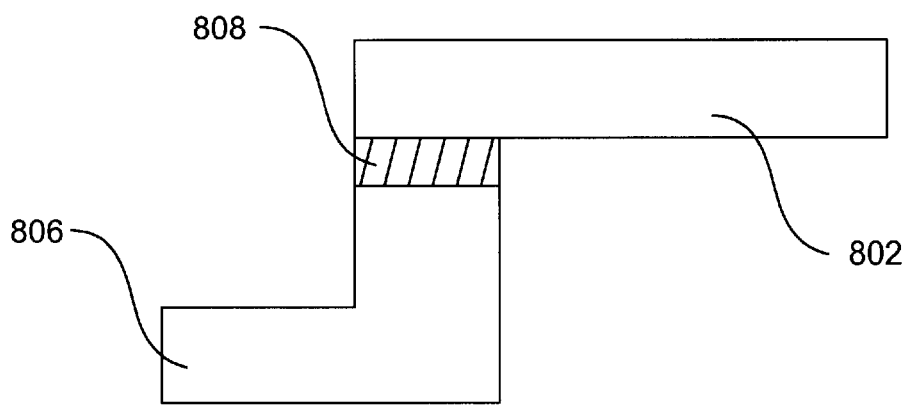
FIG. 8B is an enlarged side view of the plasma screen and holder assembly of FIG. 8A, in accordance with one embodiment of the present invention.

Furthermore, if the complexity or cost of the magnet design is prohibitive and the conductance loss can be afforded, an improved plasma screen can be made in accordance with another aspect of the present invention. Referring to FIGS. 8A & 8B, rather than bolting the plasma screen 802/803 directly, it can be bonded to a holder 804/806 of appropriate material such as Aluminum. Accordingly, physical plasma screen materials with low erosion rates and more fragile mechanical strength (i.e. low tensile stress and high brittleness) can be held in place with these more robust holders. Materials which could be used for the plasma screen 802/803 include Si and SiC. A bonding material 808 can be made with good electrical and thermal contact using an appropriate vacuum compatible material (e.g., adhesive). Furthermore, the plasma screen 802/803 can be attached to either the chamber wall 303 or the chuck 314 (in single or multiple chambers).

In addition to flexibility in unusual material choice of the plasma screen, the design of the holders can be more flexible to form very repeatable electrical and thermal connection to give repeatable system performance on reassembly. For example, complex shapes including rf gaskets and bolting surfaces can be designed with robustness and fabricated more cost effectively in Aluminum as compared to SiC or Si. Another benefit is the rf return currents from the bottom electrode (e.g., chuck 314) can be controlled reliably by providing a low impedance path back to the rf ground in the rf match system through the holder. This results in reduced circulating through questionable ground return paths of the tool. An additional benefit is that the screen material can be segmented into smaller more cost effectively manufactured sizes and attached via the holder. Also, this may be beneficial if sections of the plasma screen are required to move to enable loading and unloading of the substrate 312. Also, the present invention allows more flexibility in placing the pure material screens, e.g., SiC or Si, in locations where bolting directly is undesirable because of vacuum integrity concerns or contamination concerns from the presence of metal fasteners due to a desire to have the inner surface of the reactor that faces the plasma be entirely pure materials.

Figure 9:
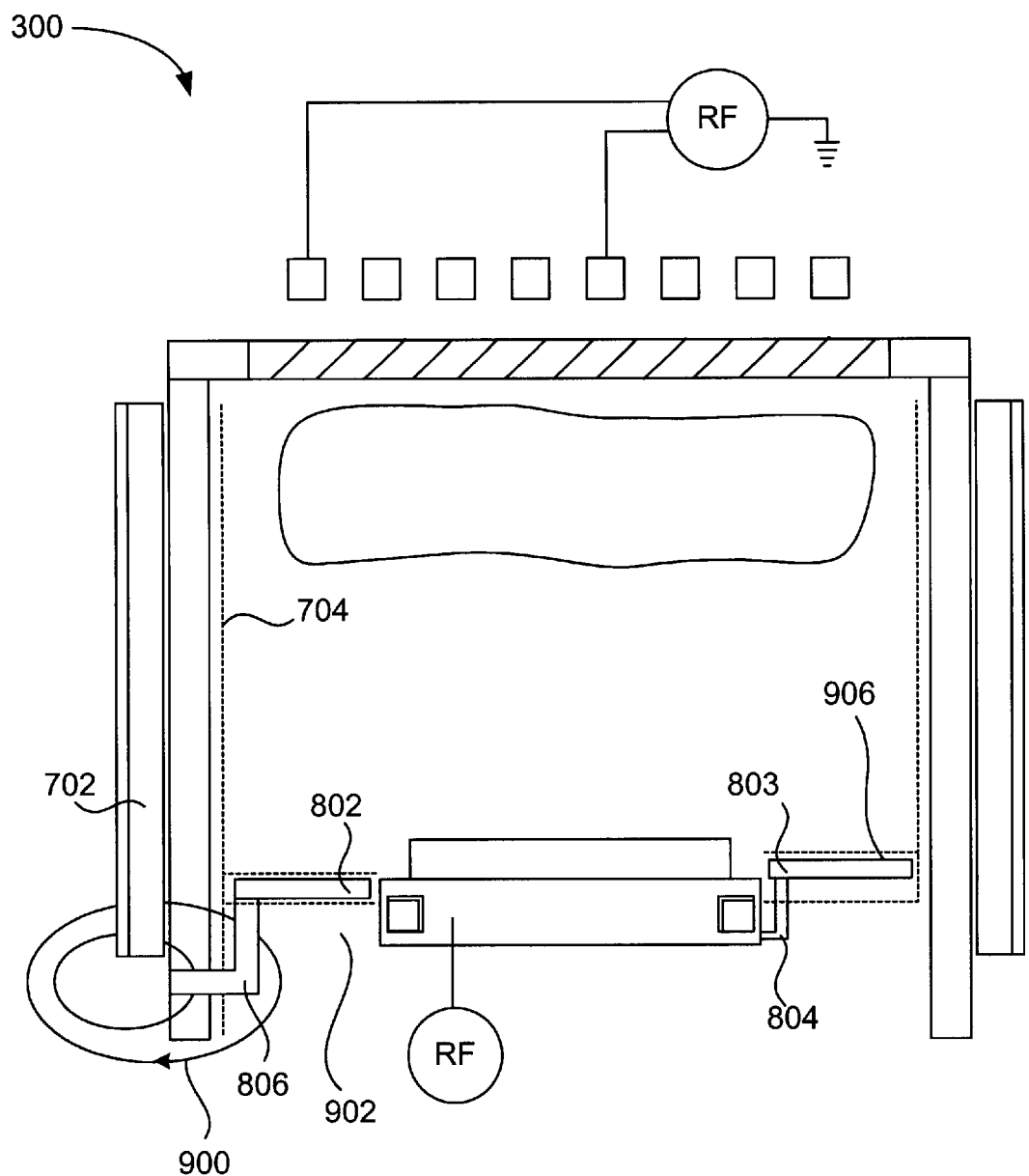
FIG. 9 illustrates the plasma processing apparatus of FIG. 7 including a plasma screen, in accordance with one embodiment of the present invention.

Further, the aforementioned plasma screen and holder assembly can be used in conjunction with the teachings set fourth above with regards to FIG. 7. Referring to FIG. 9, it is shown that the plasma screen 802/803 can be mounted using the holders 804/806 well above the end of the magnet elements 702. The use of magnetic fields 704 to define the plasma volume along the walls can lead to a difficulty when implementing a plasma screen 802/803 as referred to earlier. As shown, the fringing field lines 900 at the end of the magnet elements 702 can thread through a screen mounted low in chamber 902. This can enhance the ability of the plasma to defeat the plasma screen and extend below 902. The holes in the screen can be made small enough to prevent this, however, some conductance loss may be experienced. Alternatively the plasma screen can be located much further away from the fringing fields. However, this increases the area of the chamber in some cases which may be counter to the benefit conferred by the magnet arrangement defining the plasma volume.

In a particularly advantageous embodiment of the present invention, the plasma screen 802/803 may be placed higher in the magnet configuration where the field lines 906 lie in the plane of the plasma screen 802/803 rather than cutting across it. In this configuration the cross field diffusion is reduced and the magnetic confinement will locally inhibit the plasma diffusion through the screen. This enables larger holes in the plasma screen which increases the conductance.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A plasma processing apparatus for processing a substrate, comprising:

a substantially cylindrical process chamber within which a plasma is both ignited and sustained for said processing; and a plasma confinement arrangement, including:

an outer magnetic bucket disposed around the periphery of said process chamber, said outer magnetic bucket having a plurality of first magnetic elements that are disposed radially and symmetrically about the axis of said process chamber, said plurality of first magnetic elements being configured to produce a first magnetic field;

an inner magnetic bucket disposed inside said process chamber and having a diameter that is smaller than the diameter of said outer magnetic bucket, said inner magnetic bucket having a plurality of second magnetic elements that are disposed radially and symmetrically about the axis of said process chamber, said plurality of second magnetic elements being configured to produce a second magnetic field, said plasma confinement arrangement being configured to use said first magnetic field and said second magnetic field to produce a plasma confinement magnetic field between said outer magnetic bucket and said inner magnetic bucket that permits by-product gas from said processing to pass through while substantially confining said plasma within a volume defined at least by said substantially cylindrical process chamber and said plasma confinement magnetic field.

2. The plasma processing apparatus as recited in claim 1 wherein a portion of said first magnetic field combines with a portion of said second magnetic field, said combination producing said plasma confinement magnetic field, said plasma confinement magnetic field having a magnetic field strength effective to prevent said plasma from passing through said plasma confinement magnetic field.

3. The plasma processing apparatus as recited in claim 1 wherein said plasma confinement magnetic field, which is produced by said first magnetic field and said second magnetic field, has a combined magnetic flux in the range of about and about 50 to about 1000 Gauss.

4. The plasma processing apparatus as recited in claim 1 wherein said plasma confinement arrangement does not produce a magnetic field proximate to the surface of said substrate when said substrate is disposed within said process chamber for said processing.

5. The plasma processing apparatus as recited in claim 1 wherein said first magnetic elements are spatially offset along the axis of said process chamber, and wherein said second magnetic elements are spatially offset along the axis of said process chamber.

6. The plasma processing apparatus as recited in claim 1 wherein the total number of first magnetic elements of said plurality of first magnetic elements is equal to the total number of second magnetic elements of said plurality of second magnetic elements such that each of said first magnetic elements has a corresponding second magnetic element.

7. The plasma processing apparatus as recited in claim 6 wherein the cusps of said first magnetic elements are axially aligned with the cusps of said corresponding second magnetic elements.

8. The plasma processing apparatus as recited in claim 7 wherein the magnetization vectors of said first magnetic elements point in the same radial direction as said corresponding second magnetic elements.

9. The plasma processing apparatus as recited in claim 8 wherein the direction of the magnetization vectors of said first magnetic elements alternate around the axis of said process chamber.

10. The plasma processing apparatus as recited in claim 1 wherein said first magnetic elements and said second magnetic elements are permanent magnets.

11. The plasma processing apparatus as recited in claim 1 wherein said plasma confinement arrangement further includes a plurality of flux plates, said flux plates being configured to control stray magnetic fields produced by said first magnetic elements and said second magnetic elements.

12. The plasma processing apparatus as recited in claim 11 wherein said plurality of flux plates includes a first flux plate disposed continuously around the outer periphery of said outer magnetic bucket, said first flux plate being proximate to said first magnetic elements.

13. The plasma processing apparatus as recited in claim 12 wherein said plurality of flux plates includes a second flux plate disposed around a portion of said inner magnetic bucket, said second flux plate being configured to redirect said stray magnetic fields in a direction away from said substrate when said substrate is disposed within said process chamber during processing.

14. The plasma processing apparatus as recited in claim 13 wherein said second flux plate is disposed continuously around the inner and top periphery of said inner magnetic bucket, said second flux plate being proximate to said second magnetic elements.

15. The plasma processing apparatus as recited in claim 11 wherein said plurality of flux plates are formed from a material having high magnetic permeability.

16. The plasma processing apparatus as recited in claim 15 wherein said plurality of flux plates are formed from cold rolled steel.

17. The plasma processing apparatus as recited in claim 1 further comprising:

a plasma screen arrangement disposed inside said process chamber, said plasma screen arrangement including a plasma screen and a plasma screen support, said plasma screen support being attached to said process chamber, said plasma screen being bonded to said plasma screen support.

18. The plasma processing apparatus as recited in claim 1 wherein said plasma processing apparatus further includes a substantially cylindrical housing disposed inside the inner periphery of said substantially cylindrical process chamber, said substantially cylindrical housing having an outer diameter that is smaller than an inner diameter of said substantially cylindrical process chamber, said substantially cylindrical housing being axially aligned with said substantially cylindrical process chamber, said inner periphery of said substantially cylindrical process chamber and an outer periphery of said substantially cylindrical housing defining an annular gap therebetween, said annular gap being substantially cylindrically symmetric.

19. The plasma processing apparatus as recited in claim 18 wherein said substrate is disposed above said substantially cylindrical housing.

20. The plasma processing apparatus as recited in claim 19 wherein said inner bucket is disposed within said substantially cylindrical housing.

21. The plasma processing apparatus as recited in claim 20 wherein said plasma confinement magnetic field is disposed below said substrate when said substrate is disposed within said process chamber for said processing.

22. The plasma processing apparatus as recited in claim 21 wherein said substantially cylindrical housing represents a chuck arrangement for holding the substrate during processing.

23. The plasma processing apparatus as recited in claim 18 further comprising:
   a plasma screen arrangement disposed inside said process chamber, said plasma screen arrangement including a plasma screen and a plasma screen support, said plasma screen support being attached to said housing, said plasma screen being bonded to said plasma screen support.

24. A plasma confinement arrangement for controlling the volume of a plasma while processing a substrate inside a process chamber using a plasma enhanced process, said process chamber having an active region and a non-active region, said plasma confinement arrangement comprising:
   a first magnetic bucket having a plurality of first magnetic elements, said first magnetic elements being configured for producing magnetic fields inside said process chamber that are spaced away from said substrate when said substrate is disposed inside said process chamber for processing; and
   a second magnetic bucket having a plurality of second magnetic elements, said second magnetic elements being configured for producing magnetic fields inside said process chamber that are spaced away from said substrate when said substrate is disposed inside said process chamber for processing,
   said magnetic fields being configured to concentrate said plasma to said active region of said process chamber, and to force said plasma away from said non-active region of said process chamber.

25. The arrangement as recited in claim 24 wherein at least a portion of said magnetic fields are configured to combine so as to produce a resultant magnetic field between said first magnetic bucket and said second magnetic bucket, said resultant magnetic field being configured to permit by-product gas from said processing to pass through while substantially confining said plasma within a volume defined at least by said resultant magnetic field.

26. The arrangement as recited in claim 24 wherein said first magnetic elements and at least a portion of said second magnetic elements are disposed below a plane defined by a top surface of said substrate so as to produce said magnetic fields below said plane defined by said top surface of said substrate.

27. The arrangement as recited in claim 24 wherein individual ones of said plurality of said first magnetic elements correspond to individual ones of said plurality of said second magnetic elements, wherein corresponding individual ones of said first and second magnetic elements are axially aligned, and wherein the magnetization vectors of corresponding individual ones of said first and second magnetic elements are oriented in the same direction.

28. The arrangement as recited in claim 24 wherein said plurality of first magnetic elements are located outside of said process chamber and wherein said plurality of second magnetic elements are located inside said process chamber.

29. The arrangement as recited in claim 24 further including a plurality of flux plates, said flux plates being configured to control said magnetic fields produced by one or both of said first magnetic elements and said second magnetic elements.

30. The arrangement as recited in claim 24 wherein said plurality of first magnetic elements and said plurality of second magnetic elements are disposed around an axis of said process chamber, and wherein said plurality of second magnetic elements are positioned closer to said axis of said process chamber than said plurality of first magnetic elements.

31. A plasma processing apparatus for processing a substrate with a plasma, comprising:
   a process chamber;
   a first magnetic arrangement having a plurality of first magnetic elements, which are configured to produce a first magnetic field, wherein the magnetization vectors of adjacent ones of said plurality of first magnetic elements alternate in direction around the axis of said process chamber; and
   a second magnetic arrangement having a plurality of second magnetic elements, which are configured to produce a second magnetic field, wherein the magnetization vectors of adjacent ones of said plurality of second magnetic elements alternate in direction around the axis of said process chamber,
   wherein said first magnetic field and said second magnetic field produce a resultant magnetic field, between said first magnetic arrangement and said second magnetic arrangement, that substantially confines said plasma to a first side of said resultant magnetic field.

32. The plasma processing apparatus as recited in claim 31 wherein individual ones of said plurality of said first magnetic elements correspond to individual ones of said plurality of said second magnetic elements.

33. The plasma processing apparatus as recited in claim 32 wherein corresponding individual ones of said first and second magnetic elements are axially aligned, and wherein the magnetization vectors of corresponding individual ones of said first and second magnetic elements are oriented in the same direction.

34. The plasma processing apparatus as recited in claim 31 wherein said plurality of first magnetic elements are located outside of said process chamber and wherein said plurality of second magnetic elements are located inside said process chamber.

35. A plasma processing apparatus for processing a substrate with a plasma, comprising:
   a process chamber;
   a magnetic arrangement disposed inside said process chamber and configured for producing a magnetic field sufficiently strong to confine said plasma inside said process chamber; and a flux plate disposed inside said process chamber and surrounding a portion of said magnetic arrangement, said flux plate being configured for blocking and redirecting a portion of said magnetic field that is formed at said portion of said magnetic arrangement that is surrounded by said flux plate.

36. The plasma processing apparatus as recited in claim 35 wherein said flux plate is configured to block or redirect said portion of said magnetic field in a direction away from said substrate when said substrate is disposed inside said process chamber for processing.

37. The plasma processing apparatus as recited in claim 35 further including a substrate holder disposed inside said process chamber, said substrate holder having a surface configured to receive said substrate during said processing.

38. The plasma processing apparatus as recited in claim 37 wherein said magnetic arrangement and said flux plate are positioned within the outer periphery of said substrate holder.

39. The plasma processing apparatus as recited in claim 38 wherein said flux plate is disposed between said magnetic arrangement and said surface of said substrate holder so as to block and redirect said portion of said magnetic field in a direction away from said substrate when said substrate is received by said surface of said substrate holder.

40. The plasma processing apparatus as recited in claim 35 further including a second magnetic arrangement disposed outside said process chamber and configured for producing a second magnetic field sufficiently strong to confine said plasma inside said process chamber; and a second flux plate disposed outside said process chamber and surrounding a portion of said second magnetic arrangement, said second flux plate being configured for blocking and redirecting a portion of said second magnetic field that is formed at said portion of said second magnetic arrangement that is surrounded by said second flux plate.

41. The plasma processing apparatus as recited in claim 40 wherein said flux plate is configured to block or redirect said portion of said magnetic field in a direction towards said second magnetic arrangement, and wherein said second flux plate is configured to block or redirect said portion of said second magnetic field in a direction towards said first magnetic arrangement.

42. The plasma processing apparatus as recited in claim 40 wherein said magnetic arrangement includes a plurality of magnetic elements disposed around an axis of said process chamber, and wherein said second magnetic arrangement includes a plurality of second magnetic elements disposed around an axis of said process chamber.

43. The plasma processing apparatus as recited in claim 42 wherein said flux plate is disposed continuously around the inner periphery and top of said magnetic arrangement, and wherein said second flux plate is disposed continuously around the outer periphery of said second magnetic arrangement.

44. A method for controlling the volume of a plasma while processing a substrate in a process chamber using a plasma enhanced process, comprising:

producing a first multi-cusp magnetic field inside said process chamber with a first magnetic element, said first multi-cusp magnetic field being spaced away from a top surface of said substrate so as to minimize the effects of said first multi-cusp magnetic field proximate the top surface of said substrate;

producing a second multi-cusp magnetic field inside said process chamber with a second magnetic element, said second multi-cusp magnetic field being spaced away from the top surface of said substrate so as to minimize the effects of said second multi-cusp magnetic field proximate the top surface of said substrate;

combining said first multi-cusp magnetic field and said second multi-cusp magnetic field to produce a resultant magnetic field between said first magnetic elements and said second magnetic elements;

confining said plasma within a volume defined at least by a portion of said process chamber and said resultant magnetic field.

45. The method as recited in claim 44 wherein said first multi-cusp magnetic field is produced below a plane defined by a top surface of said substrate.

46. The method as recited in claim 45 wherein said second multi-cusp magnetic field is produced below said plane defined by said top surface of said substrate.

47. The method as recited in claim 44 wherein said first multi-cusp magnetic field and said second multi-cusp magnetic field are produced substantially parallel to a top surface of said substrate.

48. The method as recited in claim 44 wherein said first multi-cusp magnetic field and said second multi-cusp magnetic field are produced away from said substrate so as to eliminate the effects of the magnetic fields directly above the top surface of said substrate.

* * * * *